United States Patent [19]

Kiga

[11] Patent Number: 5,332,031
[45] Date of Patent: Jul. 26, 1994

[54] COOLING SYSTEM FOR COOLING A SOLID-STATE IMAGING DEVICE

[75] Inventor: Kazuyoshi Kiga, Kanagawa, Japan

[73] Assignee: Sony Corporation, Tokyo, Japan

[21] Appl. No.: 42,783

[22] Filed: Apr. 6, 1993

[30] Foreign Application Priority Data

Apr. 10, 1992 [JP] Japan .................. 4-116689

[51] Int. Cl.⁵ .......................................... H01L 23/427
[52] U.S. Cl. .................. 165/86; 165/104.14; 165/104.33; 62/3.7; 62/259.2
[58] Field of Search ........... 165/104.14, 104.33, 165/86; 62/3.1, 3.2, 3.7.259.2; 361/700

[56] References Cited

U.S. PATENT DOCUMENTS

| | | | |
|---|---|---|---|
| 4,314,449 | 2/1982 | Reisman et al. | 62/3.2 |
| 4,921,041 | 5/1990 | Abachi | 165/104.14 |
| 5,040,381 | 8/1991 | Hazen | 62/3.1 |

FOREIGN PATENT DOCUMENTS

2167550  5/1986  United Kingdom ........... 165/104.33

*Primary Examiner*—Albert W. Davis, Jr.
*Attorney, Agent, or Firm*—William S. Frommer; Alvin Sinderbrand

[57] ABSTRACT

A cooling system for cooling heat-producing electronic devices, such as CCDs, included in an electronic apparatus, such as a television camera, comprises electronic cooling devices disposed near the heat-producing electronic devices, buffering heat conducting mechanisms connecting the heat-producing electronic devices to the electronic cooling devices to transfer heat by conduction from the heat-producing electronic devices to the electronic cooling devices, a motor-driven fan disposed in an air passage formed by dividing the interior of the body of the electronic apparatus by a partition wall, and a heat radiating coil unit is formed by coiling a small tube in loops and sealing a heat conveying fluid in the small tube, such coil unit having heat absorbing portions connected to the electronic cooling devices and a heat radiating portion disposed in the air passage. Heat produced by the heat-producing electronic devices is transferred by conduction from the heat-producing devices to the electronic cooling devices through the buffering heat conducting mechanisms, an then conveyed by the heat conveying fluid to the heat radiating portion of the heat radiating coil unit from where heat is radiated into air flowing through the air passage.

6 Claims, 4 Drawing Sheets

COOLING SYSTEM FOR COOLING A SOLID-STATE IMAGING DEVICE

BACKGROUND OF THE INVENTION

1. Field of the Invention

The present invention relates to a cooling system to be incorporated into an electronic apparatus, such as a television camera or an electronic still camera, having a device that generates heat, such as a solid-state imaging device.

2. Description of the Related Art

The applicant of the present patent application has previously proposed a cooling system for cooling the solid-state imaging device of a television camera in Japanese Patent Laid-open (Kokai) No. 3-58076. This previously proposed cooling system incorporated into a television camera has a heat transfer bag filled with a fluid having a high coefficient of thermal expansion and interposed between the solid-state imaging device and the cooling portion of a Peltier device, and a heat transfer pipe connecting the heat radiating portion of the Peltier device to the casing. The Peltier device cools the solid-state imaging device through the heat transfer bag, and heat generated by the Peltier device is transferred through the heat transfer pipe to the casing. The heat transfer bag is formed of a flexible material so that the heat transfer bag may not induce mechanical stress in the solid-state image sensor even if the Peltier device is not disposed in a correct position. However, this cooling system has the following disadvantages.

1. The fluid is likely to leak from the heat transfer bag.

2. The quantity of the fluid needs periodic inspection and replenishment because the fluid dissipates by evaporation.

3. The cooling system needs a pump and an associated mechanism additionally for circulating the fluid and these additional components increase the probability of malfunction.

4. Impurities contained in the fluid are likely to clog the fluid circulating circuit of the cooling system.

5. The performance of the heat transfer bag is subject to variation with changes in the atmospheric pressure and hence the cooling system cannot be used in a vacuum.

SUMMARY OF THE INVENTION

Accordingly, it is an object of the present invention to provide a cooling system for cooling a solid-state imaging device, having a simple construction and capable of efficiently cooling the solid-state imaging device.

In accordance with one aspect of the present invention, a cooling system for cooling a solid state imaging device comprises: a spacer connected to one surface of the solid-state imaging device; a cylinder containing an electronic cooling device; a piston fitted in the cylinder and biased toward the electronic cooling device and having a spherical surface in sliding contact with the spacer; and a heat conducting device connected to the electronic cooling device so that heat generated by the solid-state imaging device is transferred thereto through the spacer, the piston and the electronic cooling device.

BRIEF DESCRIPTION OF THE DRAWINGS

The above and other objects, features and advantages of the present invention will become more apparent from the following description taken in connection with the accompanying drawings, in which.

DETAILED DESCRIPTION OF THE PREFERRED EMBODIMENTS

The present invention will be described hereinafter as applied to cooling the CCD of a television camera.

Figure 4:
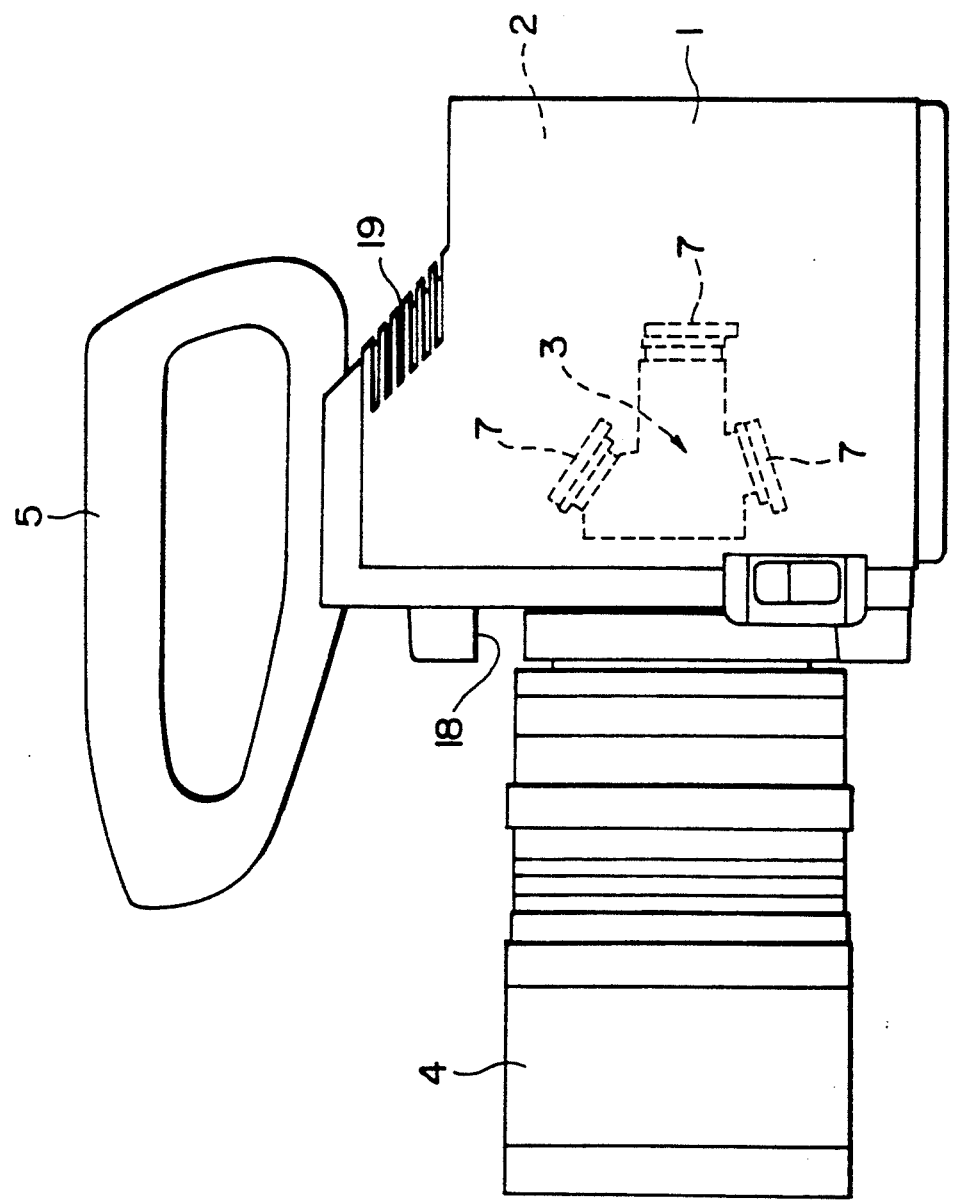
FIG. 4 is a side view of a television camera.

As shown in FIG. 4, the television camera has a camera body 1 defining a chamber 2, a three-plate image pickup device 3 received in the chamber 2, an optical lens 4 mounted on the front wall of the camera body 1, and a handle 5 attached to the upper wall of the camera body 1.

Figure 2:
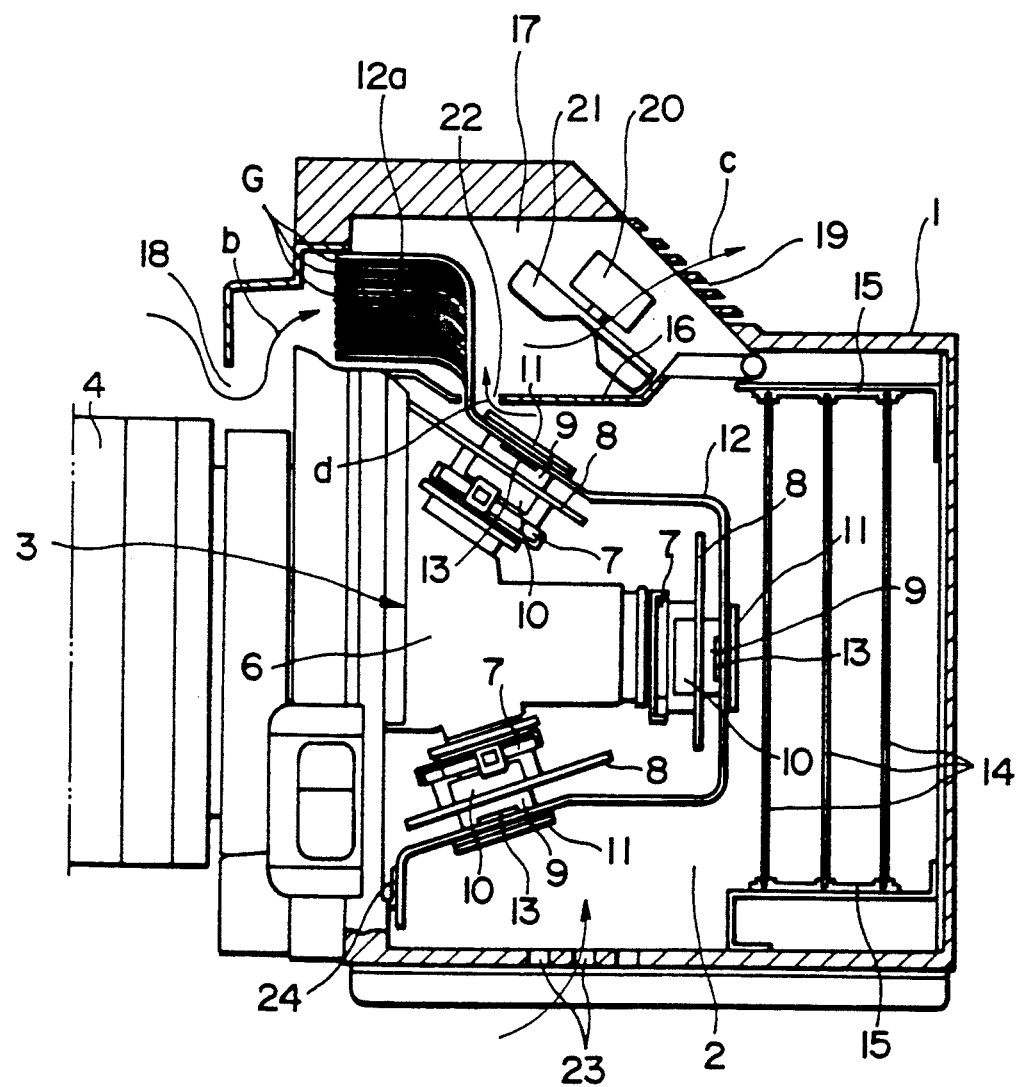
FIG. 2 is a partly cutaway side view of the cooling system for cooling a solid-state imaging device, embodying the present invention.

Referring to FIG. 2, the three-plate image pickup device disposed in the front portion of the chamber 2 has a prism 6, three CCDs 7, i.e., solid-state imaging devices, respectively for red light, green light and blue light, fixedly attached to the three surfaces of the prism 6, respectively, and three wiring boards 8 disposed behind the three CCDs 7, respectively. The three CCDs 7 are connected to the three wiring boards 8 by wires, respectively.

The heat absorbing side of a Peltier device 9, i.e., an electronic cooling device, is connected through a buffering heat conducting mechanism 10 to the back of each CCD 7. A heat radiating plate 11 is attached fixedly to the heat radiating side of each Peltier device 9. The three heat radiating plates 11 are attached fixedly to three heat transfer plates 13 included in a substantially U-shaped, heat radiating coil unit 12 covering the space behind the image pickup device 3. A plurality of printed wiring boards 14 provided with CCD driving circuits, signal processing circuits and the like are inserted in grooves formed in a pair of guides 15 and supported in a vertical position in the rear portion of the chamber 2.

A partition wall 16 is extended in the upper end of the chamber 2 to form an air passage 17 for forced-air cooling, and an air inlet 18 and an air outlet 19 are formed in the camera body 1 at the front and rear ends, respectively of the air passage 17. A fan 21 driven by a motor 20 is disposed in the air passage 17 at a position near the air outlet 19. An air outlet 22 is formed in the partition wall 16 at a position before the fan 21 with respect to the flowing direction of air, and air inlets 23 are formed in the bottom wall of the camera body 1. A heat radiating portion 12a formed at the upper end of the heat radiating coil unit 12 is inserted through the air outlet 22 into the air passage 17.

Figure 3B:
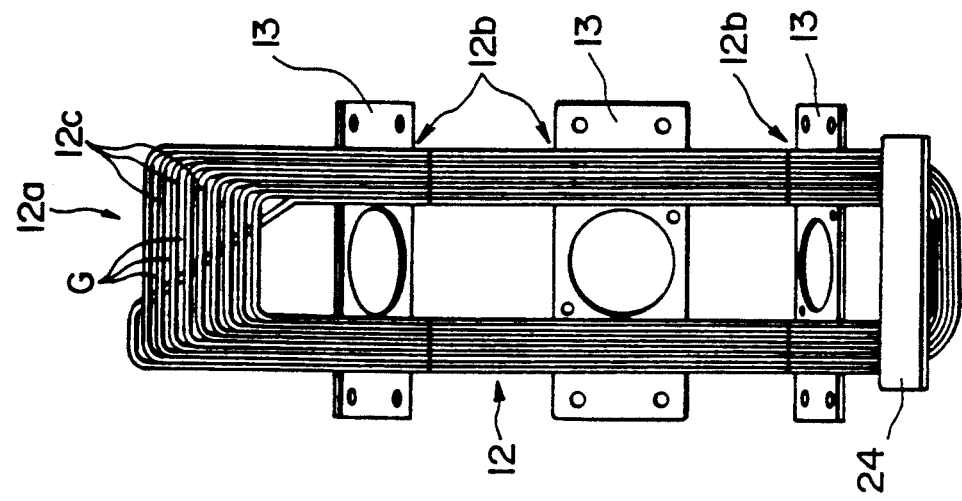
FIGS. 3 (A) and 3(B) are a side view and a front view, respectively, of a heat radiating coil unit.
Figure 3A:
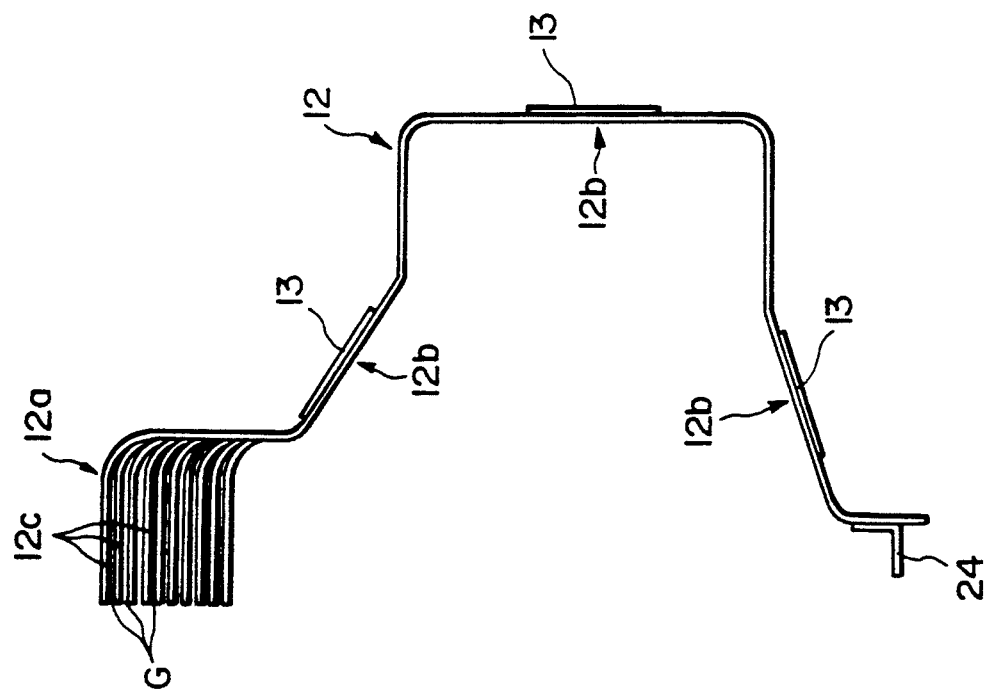

Referring to FIGS. 3(A) and 3(B), the heat radiating coil unit 12 is formed by coiling a flexible, small tube 12c of a highly heat-conductive material, such as aluminum or copper, having a diameter in the range of about 1 mm to about 4 mm in closely arranged loops, and bending the closely arranged loops substantially in a U-shape in side view. The three heat transfer plates 13 formed of a highly heat-conductive material, such as copper, are attached adhesively or by suitable means respectively to the three heat transfer portions 12b of the heat radiating coil unit 12. A working fluid that conveys heat from the heat transfer portions 12b to the heat radiating portion 12a is sealed in the small pipe or tube 12c to make the heat radiating coil unit 12 function like a heat pipe. The working fluid conveys heat by the propagation and axial vibrations of pressure waves produce by nucleate boiling corresponding to the quantity of heat transferred thereto through the heat transfer portions 12b. The heat radiating coil unit 12 is capable of conducting heat at a very high efficiency. Appropriate gaps G are formed between the adjacent loops of the small tube 12c in the heat radiating portion 12a to make the portions of the loops of the small tube 12c in the heat radiating portion 12a serve as heat radiating fins. As shown in FIG. 2, a support plate 24 adhesively attached to the lower end of the heat radiating coil unit 12 is fastened to the inner surface of the front wall of the camera body 1.

Figure 1:
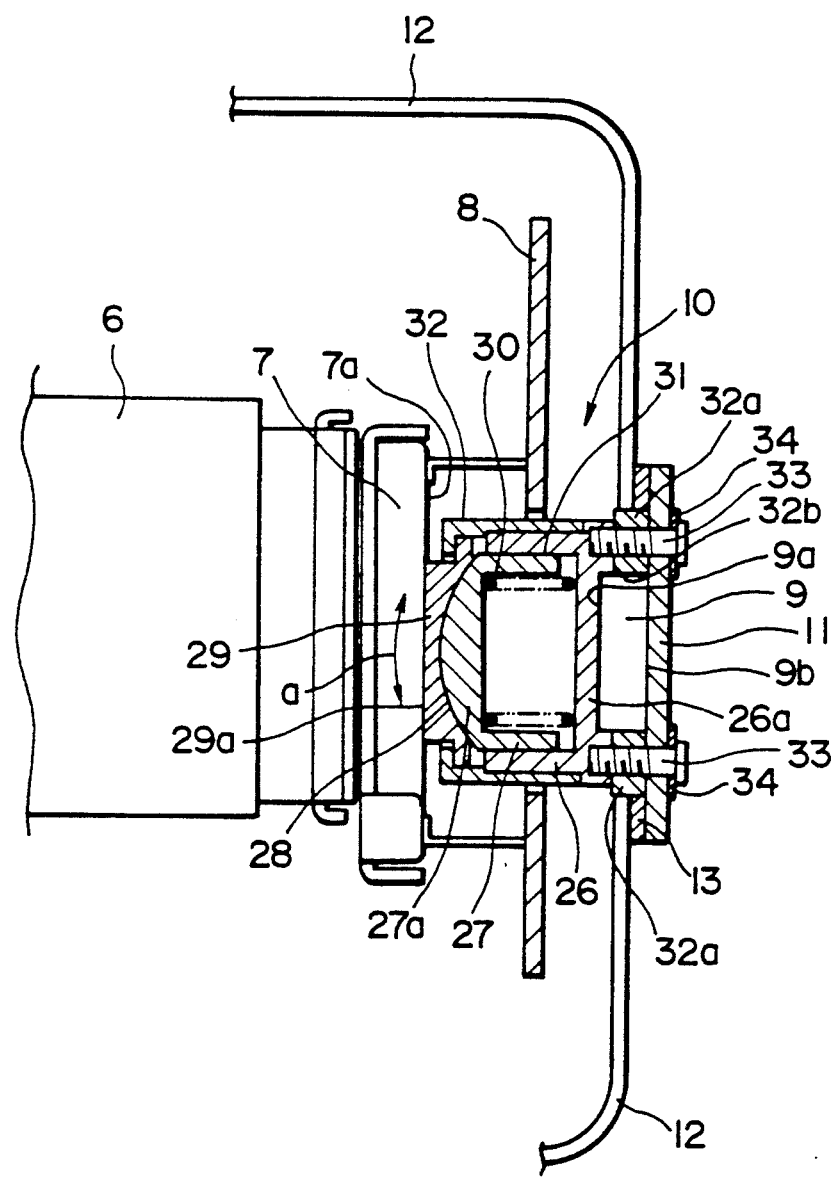
FIG. 1 is a sectional view of a buffering heat conducting mechanism included in a cooling system for cooling a solid-state imaging device, in a preferred embodiment according to the present invention.

As shown in to FIG. 1, the buffering heat conducting mechanism 10 interconnecting the CCD 7 and the Peltier device 9 comprises a cylinder 26, a piston 27 slidably fitted in the cylinder 26 and having a head wall 27a with a spherical surface 28 having its center on the axis of the piston 27, a swivel spacer 29 having a concave contact surface of a shape conforming to the spherical surface 28 of the piston 27 and being disposed with the concave contact surface thereof in close contact with the spherical surface 28 of the piston 27 and capable of sliding along the spherical surface 28 of the piston in directions as indicated by the arrows a, and a compression coil spring 30 compressed between the bottom wall 26a of the cylinder 26 and the head wall 27a of the piston 27 to press the piston 27 against the swivel spacer 29 so that the flat front surface 29a of the swivel spacer 29 is pressed closely against the flat back surface 7a of the CCD 7. The cylinder 26, the piston 27 and the swivel spacer 29 are formed of a highly heat-conductive material, such as aluminum, and the circumferential surface 31 of the piston 27 in sliding contact with the cylinder 26, and the spherical surface 28 of the piston 27 in sliding contact with the swivel spacer 29 are lubricated with a highly heat-conductive grease, such as silicone grease.

The cylinder 26 and the swivel spacer 29 are covered with a cover 32 formed of an insulating material, such as a glassfiber reinforced plastic. The Peltier device 9 is fitted in the center hole 32b of a flange 32a of the cover 32 with its heat absorbing surface 9a in contact with the flat bottom wall 27a of the cylinder 26. The heat radiating plate 11 is fastened to the flange 32a with screws 33 so as to be in close contact with the heat radiating surface 9b of the Peltier device 9 so that the Peltier device 9 is held between the bottom wall 26a of the cylinder 26 and the heat radiating plate 11. Washers 34 formed of an insulating glassfiber reinforced plastic or the like are interposed between the heads of the screws 33 and the heat radiating plate 11. The heat radiating plate 11 is fastened to the respective heat conducting plate 13 attached to the heat radiating coil unit 12 with screws, not shown.

As shown in FIG. 1, in the television camera thus constructed, the swivel spacer 29 is able to slide on the spherical surface 28 of the piston 27 in any direction so that the flat front surface thereof is in close contact with the back surface 7a of the CCD 7 when the swivel spacer 29 is pressed against the flat back surface 7a of the CCD 7 through the piston 27 by the compression coil spring 30 of the buffering heat conducting mechanism 10. Accordingly, the flat front surface 29a of the swivel spacer 29 can be put in close contact with the flat back surface 7a of the CCD 7 without inducing mechanical stress in the CCD 7, even if the Peltier device 9 is inclined relative to the CCD 7.

Since the cylinder 26, the piston 27 and the swivel spacer 29 can be disposed in contact with each other with a high accuracy, the thermal resistance between the heat absorbing surface 9a of the Peltier device 9 and the CCD is reduced to enable efficient transfer of heat by conduction from the CCD 7 to the Peltier device 9.

When a current is supplied to the Peltier device 9, heat generated by the CCD 7 can be absorbed effectively through the heat absorbing surface 9a and radiated effectively through the heat radiating surface 9b and the heat radiating plate 11 to cool the CCD 7 efficiently.

Since the piston 27 is fitted slidably in the cylinder 26, the swivel spacer 29 is put in sliding contact with the spherical surface 28 of the piston 27 and the swivel spacer 29 need not be supported on shafts perpendicularly intersecting each other to enable the swivel spacer 29 to move in optional directions, the buffering heat conducting mechanism 10 has a simple construction and can be easily fabricated.

As shown in FIGS. 2, 3(A) and 3(B), heat generated by the three CCDs 7 is transferred by conduction through the three Peltier devices 9, the three heat radiating places 11 contiguous with the three Peltier devices 9 and the three heat conducting plates 13 to the heat transfer portions of the heat radiating coil unit 12, and then the heat is conveyed by the working fluid sealed in the heat radiating coil unit 12 to the heat radiating portion 12a disposed in the air passage 17. The ambient air is sucked through the air inlet 18 into the air passage 17 in the direction of the arrow b by suction generated by fan 21 driven by the motor 20, whereupon the ambient air is caused to flow through the gaps G between the portions of the loops in the heat radiating portion 12a in the direction of the arrow c for the forced-air cooling of the heat radiating portion 12a, and to flow outside through the air outlet 19. Thus, heat can be efficiently removed from the heat radiating portion 12a, and the three CCDs 7 can be efficiently cooled by readily and uniformly removing heat from the three Peltier device 9 by the heat radiating coil unit 12.

Since the heat radiating coil unit 12 is flexible, the heat radiating coil unit 12 can be easily installed in a narrow space. Since the heat radiating coil unit 12 conveys heat from the heat transfer portions 12b to the heat radiating portion 12a by the propagation and axial vibration of the pressure waves produced by the nucleate boiling of the working fluid sealed in the heat radiating coil unit 12, the performance of the heat radiating coil unit 12 is scarcely influenced by to the position of the television camera and has a simple, lightweight construction.

Since the air outlet 22 of the chamber 2 opens into the air passage 17 at a position before the fan 21 with respect to the flowing direction of air, the warm air prevailing in the chamber 2 can be sucked through the air outlet 22 into the air passage 17 as indicated by the arrow d in FIG. 2 and the ambient air can be sucked through the air inlets 23 into the chamber 2. Thus, the fan 21 achieves the forced cooling of the heat radiating portion 12a and the forced exhaustion of the warm air prevailing in the chamber 2 simultaneously, whereby the chamber 2 is ventilated efficiently, and the three CCDs 7 and the wiring boards 14 can be efficiently cooled.

Although the present invention has been described as applied to cooling the CCDs of a television camera, the present invention is not limited thereto in its application and can be applied to cooling various hot components of various electronic apparatuses.

As is apparent from the foregoing description, the swivel spacer 29 can be set in close contact with the hot component without inducing mechanical stress in the hot component, i.e., the CCD, even if the electronic cooling device, i.e., the Peltier device 9, is not disposed in a correct position or orientation relative to the hot component, because the buffering heat conducting mechanism allows to conform to the position of the hot component. Since the buffering heat conducting mechanism is assembled by slidably fitting the piston in the cylinder and slidably putting the swivel spacer on the spherical surface of the piston, and the cylinder, the piston and the swivel spacer are put accurately into contact with each other, the thermal resistance between the electronic cooling device and the hot component can be reduced for efficient heat transfer from the hot component to the electronic cooling device.

Since the buffering heat conducting mechanism need not be provided with any shafts for supporting the swivel spacer, the buffering heat conducting mechanism has a simple construction and can be easily fabricated.

Since the fan 21 sucks the ambient air forcibly into the air passage 17 and discharges the ambient air forcibly for the forced-air cooling of the heat radiating portion 12a of the heat radiating coil unit 12, heat of the heat conducting components can be efficiently dissipated.

Since the fan functions for both the forced cooling of the heat radiating portion of the heat radiating coil unit in the air passage and the forced exhaustion of the warm air from the chamber 2 containing the hot components 7, the chamber can be efficiently ventilated and the hot components can be efficiently cooled.

Since the heat radiating coil unit is formed by coiling a flexible, small tube of a highly heat conductive material and sealing the working fluid in the flexible, small tube, the performance of the heat radiating coil unit is scarcely influenced by the position of the electronic apparatus, i.e., the television camera, the hot components can be efficiently cooled, and the flexible heat radiating coil unit can be easily installed in a narrow space.

Although the invention has been described in its preferred form with a certain degree of particularity, obviously many changes and variations are possible therein. It is therefore to be understood that the present invention may be practiced otherwise than as specifically described herein without departing from the scope and spirit thereof.

What is claimed is:

1. A cooling system for cooling heat-producing electronic devices included in an electronic apparatus having a body with a chamber therein containing the heat-producing electronic devices, said cooling system comprising:

electronic cooling devices disposed respectively near the heat-producing electronic devices;

buffering heat conducting mechanisms connecting the heat-producing electronic devices respectively to the electronic cooling devices and each including first and second members of highly heat-conductive material having mating, part-spherical surfaces which are universally slidable relative to each other about a common center, elastic means urging said part-spherical surfaces toward each other so as to maintain efficient heat conduction thereacross in the event of the angular shifting of said heat-producing electronic devices relative to the respective electronic cooling devices, and highly heat-conductive connecting means between said first member and the respective heat-producing electronic device and between said second member and the respective electronic cooling device, one of said connecting means having mating cylindrical surfaces which are slidable relative to each other in an -axial direction passing through said common center for accommodating relative bodily movements of each of said heat-producing electronic devices and the respective electronic cooling device in said axial direction;

a partition wall extended in said chamber of the body so as to form an air passage for forced-air cooling;

a motor-driven fan disposed in said air passage; and a heat radiating coil unit formed of a small tube coiled in loops and a heat conveying fluid sealed in the small tube, said coil unit having heat absorbing portions with heat-conductive connections to the electronic cooling devices, and a heat radiating portion disposed in said air passage.

2. A cooling system according to claim 1, wherein said electronic cooling devices are Peltier devices.

3. A cooling system according to claim 1, wherein said electronic apparatus is a color television camera, and said heat-producing electronic devices are CCDs.

4. A cooling system for cooling heat-producing electronic devices included in an electronic apparatus having a body with a chamber therein containing the heat-producing electronic devices, said cooling system comprising:

electronic cooling devices disposed respectively near the heat-producing electronic devices;

buffering heat conducting mechanisms connecting the heat-producing electronic devices respectively to the electronic cooling devices, each of said buffering heat conducting mechanisms including:

a case formed of a highly heat-conductive material, a cylinder formed of a highly heat-conductive material and held in said case, a piston of a highly heat-conductive material which is slidably fitted in the cylinder, and having a head wall with a spherical surface, a swivel spacer having a concave surface conforming to said spherical surface of the head wall of the piston, disposed against the piston with the concave surface thereof in close contact with the spherical surface of the head wall of the piston and held in said case for free sliding movement along the spherical surface of the head wall of the piston, and an elastic member elastically pressing said piston against said swivel spacer, and the contact surfaces of the cylinder, the piston and the swivel spacer being lubricated with a highly heat-conductive lubricant;

a partition wall extended in said chamber of the body so as to form an air passage for forced-air cooling;

a motor-driven fan disposed in said air passage; and a heat radiating coil unit formed of a small tube coiled in loops, a heat conveying fluid sealed in the small tube, heat absorbing portions having heat conductive connections to the electronic cooling devices, and a heat radiating portion disposed in said air passage.

5. A cooling system according to claim 1, wherein said body of the electronic apparatus has a front wall and an upper wall, an air inlet and an air outlet are formed respectively in the front wall and upper wall so as to open into the atmosphere, said heat radiating portion of the heat radiating coil unit is disposed in the air passage at a position near said air inlet, and said motor-driven fan is disposed in the air passage at a position near said air outlet.

6. A cooling system according to claim 5, wherein said body also has a bottom wall, an air outlet is formed in said partition wall at a position before the motor-driven fan with respect to the direction of flow of air in said air passage to enable warm air prevailing in said chamber to flow therethrough from the chamber into said air passage, and air inlets are formed in said bottom wall of the body to enable the ambient air to flow therethrough into the chamber.

* * * * *